(12) United States Patent
Saraswat et al.

(10) Patent No.: US 8,737,108 B2
(45) Date of Patent: May 27, 2014

(54) 3D MEMORY CONFIGURABLE FOR PERFORMANCE AND POWER

(71) Applicants: Ruchir Saraswat, Swindon (GB); Matthias Gries, Braunschweig (DE)

(72) Inventors: Ruchir Saraswat, Swindon (GB); Matthias Gries, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 13/626,720

(22) Filed: Sep. 25, 2012

(65) Prior Publication Data

US 2014/0085959 A1   Mar. 27, 2014

(51) Int. Cl.
*G11C 5/02* (2006.01)
*G11C 5/04* (2006.01)

(52) U.S. Cl.
USPC .............................................. 365/63; 365/51

(58) Field of Classification Search
CPC .................................... G11C 5/02; G11C 5/04
USPC ...................................................... 365/51, 63
See application file for complete search history.

(56) References Cited

U.S. PATENT DOCUMENTS

| | | | | |
|---|---|---|---|---|
| 6,377,483 | B1* | 4/2002 | Arimoto et al. | 365/149 |
| 7,200,021 | B2* | 4/2007 | Raghuram | 365/51 |
| 7,269,042 | B2* | 9/2007 | Kinsley et al. | 365/52 |
| 7,913,000 | B2* | 3/2011 | Chung | 710/52 |
| 8,031,505 | B2* | 10/2011 | Kang et al. | 365/51 |
| 8,233,303 | B2* | 7/2012 | Best et al. | 365/51 |
| 8,369,122 | B2* | 2/2013 | Byeon et al. | 365/51 |
| 2011/0249483 | A1* | 10/2011 | Oh et al. | 365/63 |
| 2013/0135915 | A1* | 5/2013 | Kim | 365/51 |
| 2013/0155794 | A1* | 6/2013 | Wu et al. | 365/200 |
| 2013/0162282 | A1* | 6/2013 | Hatakeyama et al. | 324/762.01 |

* cited by examiner

*Primary Examiner* — Son Mai
(74) *Attorney, Agent, or Firm* — Blakely, Sokoloff, Taylor & Zafman LLP

(57) ABSTRACT

A 3D memory that is configurable for performance and power. An embodiment of a memory device includes a dynamic random-access memory (DRAM) including multiple memory dies, each memory die including multiple memory arrays, each memory array including peripheral logic circuits and a configurable logic. The memory device further includes a system element coupled with the DRAM, the system element including a memory controller. The memory controller is to provide for control of the configurable logic to provide for separate or shared peripheral logic circuits for one or more memory arrays, the configurable logic being configurable to enable or disable one or more of the peripheral logic circuits and to enable or disable one or more I/O connections between the memory arrays.

29 Claims, 8 Drawing Sheets

US 8,737,108 B2

3D MEMORY CONFIGURABLE FOR PERFORMANCE AND POWER

TECHNICAL FIELD

Embodiments of the invention generally relate to the field of electronic devices and, more particularly, a 3D memory that is configurable for performance and power.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

Among the advantages of stacked memory is the ability to provide for a large amount of memory in a compact memory device, where such memory may be used in many different types of computer environments, from large server operations to small mobile devices.

However, there are limitations in stacked memory design that can create issues in certain implementations. A stacked memory device that is designed for maximum performance, such as a device that includes separate row and column decoders and sense amplifiers for each memory array, may draw an amount of power that is significant when such a memory device is used in a mobile device with limited power storage capacity, thus limiting the applications for such a stacked memory device.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
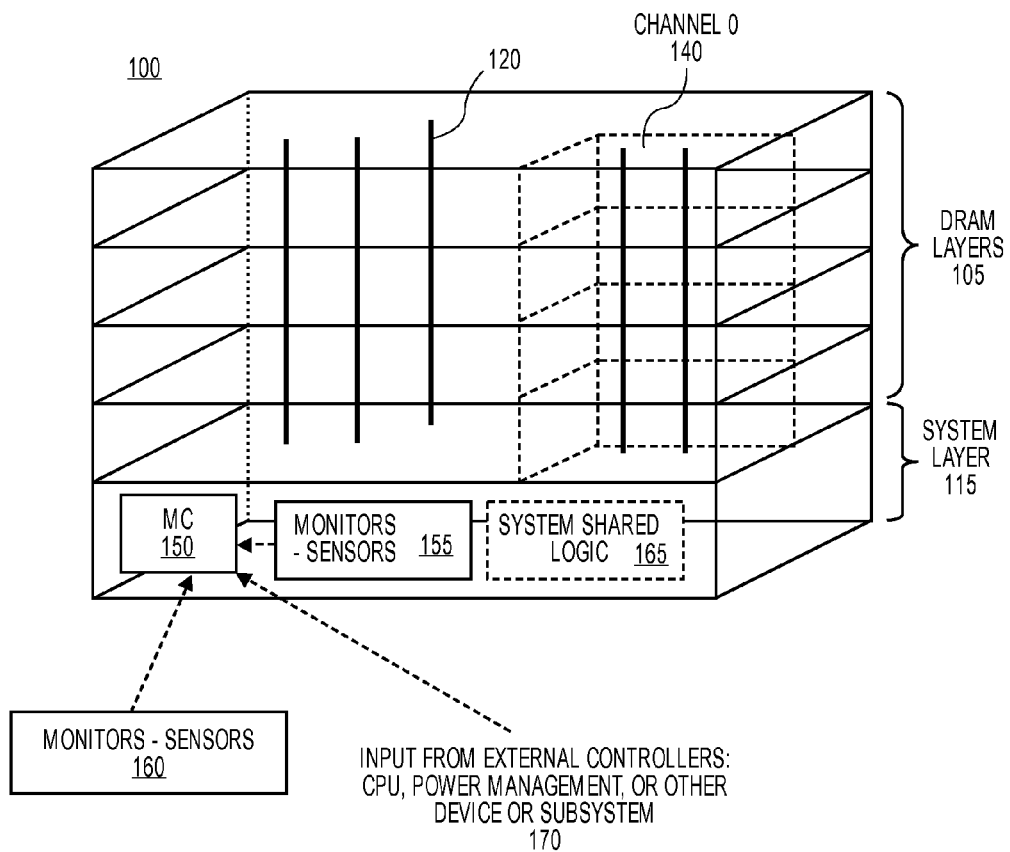
FIG. 1 is an illustration of a 3D stacked memory.

Embodiments of the invention are generally directed to a 3D memory that is configurable for performance and power.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics processing unit (GPU).

With the advent of the stacked DRAM standard (such as the WideIO standard), the DRAM wafer may be stacked with a system element such as a system on chip (SoC) wafer in the same package with a memory stack. The stacked memory may utilize through silicon via (TSV) manufacturing techniques, where vias are produced through silicon dies to provide signal and power paths through the memory stack.

A stacked memory device may include a system chip and one or more DRAM chips, the DRAM chips forming memory strata or layers coupled with the system chip. Each memory stratum may include a plurality of tiles (or portions) of memory. The stacked memory device may include multiple channels, where a channel may include a column of tiles, such as a tile in each of the strata of the memory device. In some embodiments, a memory device may be a WideIO compatible memory device.

However, a conventional stacked memory device may not be desirable in certain implementations. For example, if the stacked memory device is designed for maximum or increased performance, the power draw of the stacked memory device may make the memory device less desirable for use in a mobile device, which does not require maximum performance and has limited power storage. On the other hand, a stacked memory device that is designed to reduce consumption by sharing the operation of certain components will reduce the performance of memory device, thus making the memory device less desirable in an environment that requires high performance, such as a server or other similar implementation. Further, the power or performance needs in any particular apparatus or system may change dynamically in operation.

In some embodiments, a memory device is configurable to define whether memory dies or arrays on a die utilize peripheral logic circuits for the memory arrays, thus providing increased memory granularity and performance, or such memory dies or arrays share certain peripheral logic circuits, thus reducing power consumption by the memory device. As used herein, the logic circuits generally include decoders or other logic, sense amplifiers, and input/output buffers. In some embodiments, a memory device is configurable to define whether memory dies or arrays on a die utilize sense amplifiers and column decoders for the memory arrays or share sense amplifiers and column decoders with one or more other memory dies or arrays. In some embodiments, a memory device may further include shared logic that is present on a system element, which may be referred to herein as system shared logic, where a set of memory arrays may be configured to utilize such system shared logic.

In some embodiments, the logic of an apparatus or system is reconfigurable for adaptively controlling the number of dies or memory arrays that are coupled with separate or shared logic circuits for memory operation. In some embodiments, the memory device may provide for improved control and micro-architecture for the stack that can be customized during run-time to adapt to the current state of the apparatus or system.

In some embodiments, depending upon the power or performance state of an apparatus or system, the memory stack may be configured to have a die-level DRAM array granularity, providing for enabling decoders and sense amplifiers for each array, or may be configured for a 3D DRAM control structure where shared decoders and sense amplifiers are enabled, with certain other decoders and sense amplifiers being disabled. In some embodiments, a memory device may provide for a mixed granularity, wherein certain arrays of the stacked memory device share a 3D logic structure while others work in a 2D configuration without the sharing of such logic circuits. In some embodiments, a stacked memory device includes an algorithm for changing configuration adaptively depending on the current circumstances, the algorithm providing for adaptively selecting the performance/power state for the 3D DRAM based on a monitor, sensor, policy input, or other data, or based upon a combination of such data.

In some embodiments, with a dynamic reconfiguration process during runtime, a memory controller operates to adjust the operating point of memory subsystem power and performance and, for example, may enable a high performance mode of operation; a low power, low performance mode of operation; or any number of other mixed modes of operation. In some embodiments, the memory controller utilizes the fine-grain control of structures in 3D memory stacks provided by the enabling and disabling of peripheral logic circuits and I/O (input/output) connections, such as the connection of bitlines of a memory die to bitlines of a neighboring memory die, to provide more efficient use of a memory subsystem.

FIG. 1 is an illustration of an embodiment of a 3D stacked memory. In this illustration, a 3D stacked memory device 100, such as a WideIO memory device, includes a system layer or other element 115. The system element 115 is coupled with one or more DRAM memory die layers 105, also referred to herein as the memory stack. In some embodiments, the system element 115 may be an SoC or other similar element. In this illustration, the DRAM memory die layers include four memory die layers. However, embodiments are not limited to any particular number of memory die layers in the memory stack 105, and may include a greater or smaller number of memory die layers. Each die layer may include one or more slices or portions, and have one or more different channels, including, for example, a channel 0 (140). Each die layer may include elements related to the stacked memory structure, including, for example, a temperature compensated self-refresh (TCSR) circuit to address thermal issues, where the TCSR and a mode register may be a part of management logic of the device.

Among other elements, the system element 115 may include a memory controller 150, such as a WideIO memory controller, for the memory stack 105. In some embodiments, each memory die layer, with the possible exception of the top (or outermost) memory die layer of the memory stack, includes a plurality of TSVs 120 to provide signal and power paths through the memory die layers. While a small number or TSVs are provided in FIG. 1 for ease of illustration, an actual number of TSVs would be much greater.

In some embodiments, the memory device 100 is reconfigurable to modify the logic structure for the DRAM layers 105. In some embodiments, the memory controller 150 may dynamically configure the logic of the memory device to control whether dies or memory arrays are coupled with separate or shared logic circuits for memory operation, where the peripheral logic of a memory array in a die layer may be shared with one or more neighboring die layers. In some embodiments, the dynamic configuration may be based on a policy input or signals from one or more monitors or sensors, illustrated here as one or more internal sensors 155 for the memory device 100 and one or more external sensors 160, and may be based on input received from external controllers, such as the CPU (central processing unit), power management, or other device or subsystem 170. In some embodiments, the memory device may additionally include system shared logic 165 on the system layer to provide for shared logic operation for memory arrays of multiple memory dies.

Figure 2:
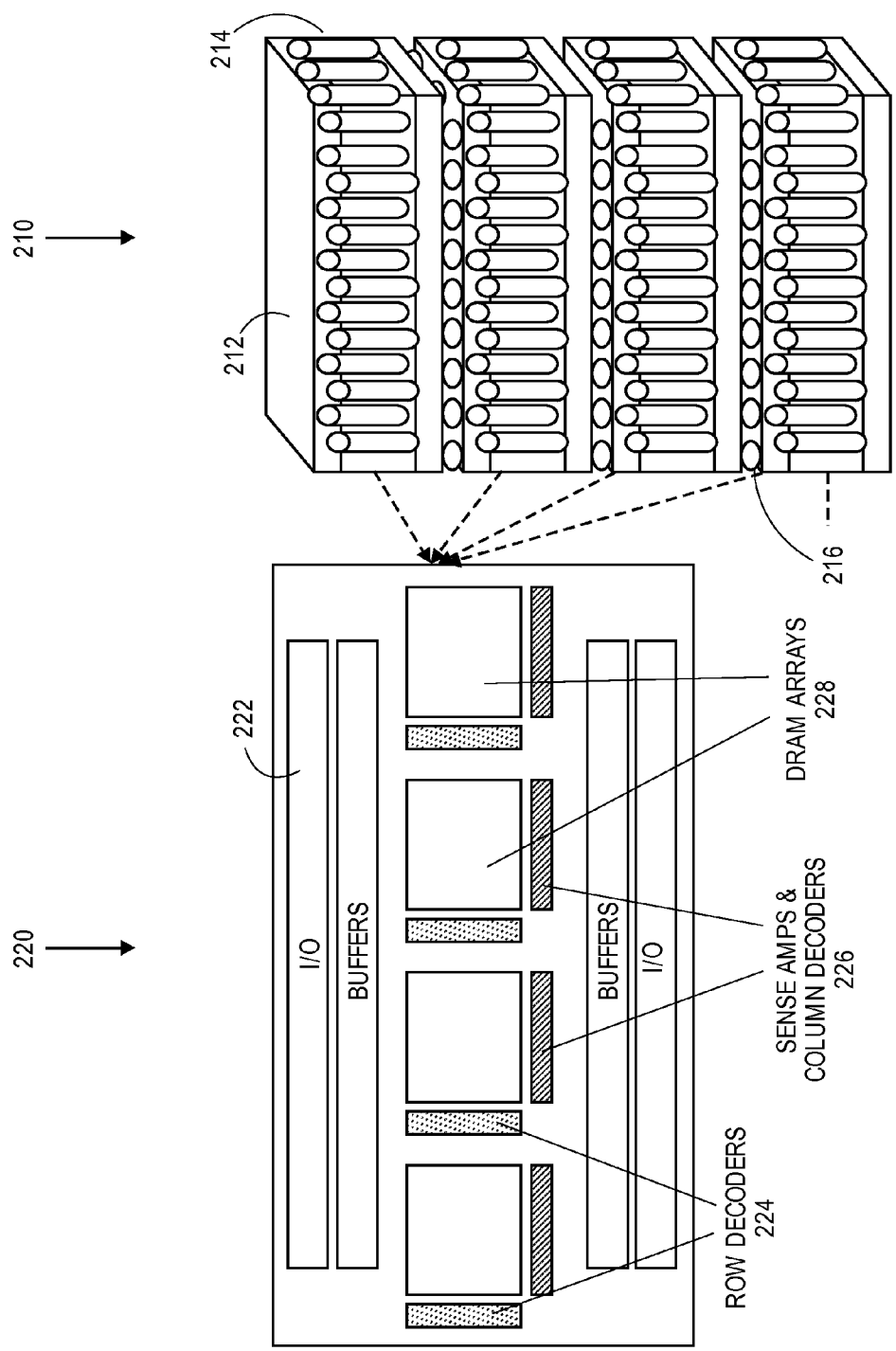
FIG. 2A is an illustration of a DRAM device.
FIG. 2B is an illustration of organization of memory in a 3D stacked memory.

FIG. 2A is an illustration of a DRAM device. In such a DRAM device 220, there are generally multiple DRAM arrays 228 in a horizontal arrangement. For each DRAM array 228 there is a set of row decoders 224 and sets of sense amplifiers and column decoders 226. In general operation, a row decoder selects a particular wordline that corresponds to a row of memory cells that contains a particular memory cell, and a column decoder selects the particular bitline that correspond to the column of memory cells that contains the memory cell. Also illustrated are I/O (input/output) buffers 222 for use in the input and output of data.

In FIG. 2A, the addressing of each DRAM array utilizes elements for row decoding, column decoding, and sensing of memory element. While such structure is reasonable for a 2D memory, as memories are constructed as 3D stacks for integrated circuits and memory bound together by TSVs, the architecture of FIG. 2A does not take advantage of the third dimension providing by the stacking of memory dies. In some embodiments, the structure of FIG. 2A is implemented in a configurable arrangement for 3D memory.

FIG. 2B is an illustration of organization of memory in a 3D stacked memory. In this illustration, a memory device 210 includes a 3D stack of several memory dies, where such dies may be conventional memory dies. The stack consists of individual dies 212 stacked together using TSVs 214, with the dies being coupled with microbumps 216. If a memory device provides or includes conventional operation, then each of the memory dies 212 would include conventional logic for memory operation including sense amplifiers for each memory array. Having separate sense amplifiers for each memory array may provide necessary granularity required for, as an example, high performance systems, but such a structure does not provide flexibility for modifying the operation of the memory device depending on the implementation of the memory device or the conditions of operation.

In some embodiments, a system provides for configurable logic for the dies of the stacked memory device. For example, for low power devices, such as tablets and mobile phones, performance may be traded off for gains in power efficiency, while high performance may be provided when required in a system such as a server or other similar apparatus or system. However, embodiments are not limited to these particular examples, and any apparatus or system containing a configurable stacked memory device may make use of the full dynamic range of operating points of the configurable stack.

Figure 3:
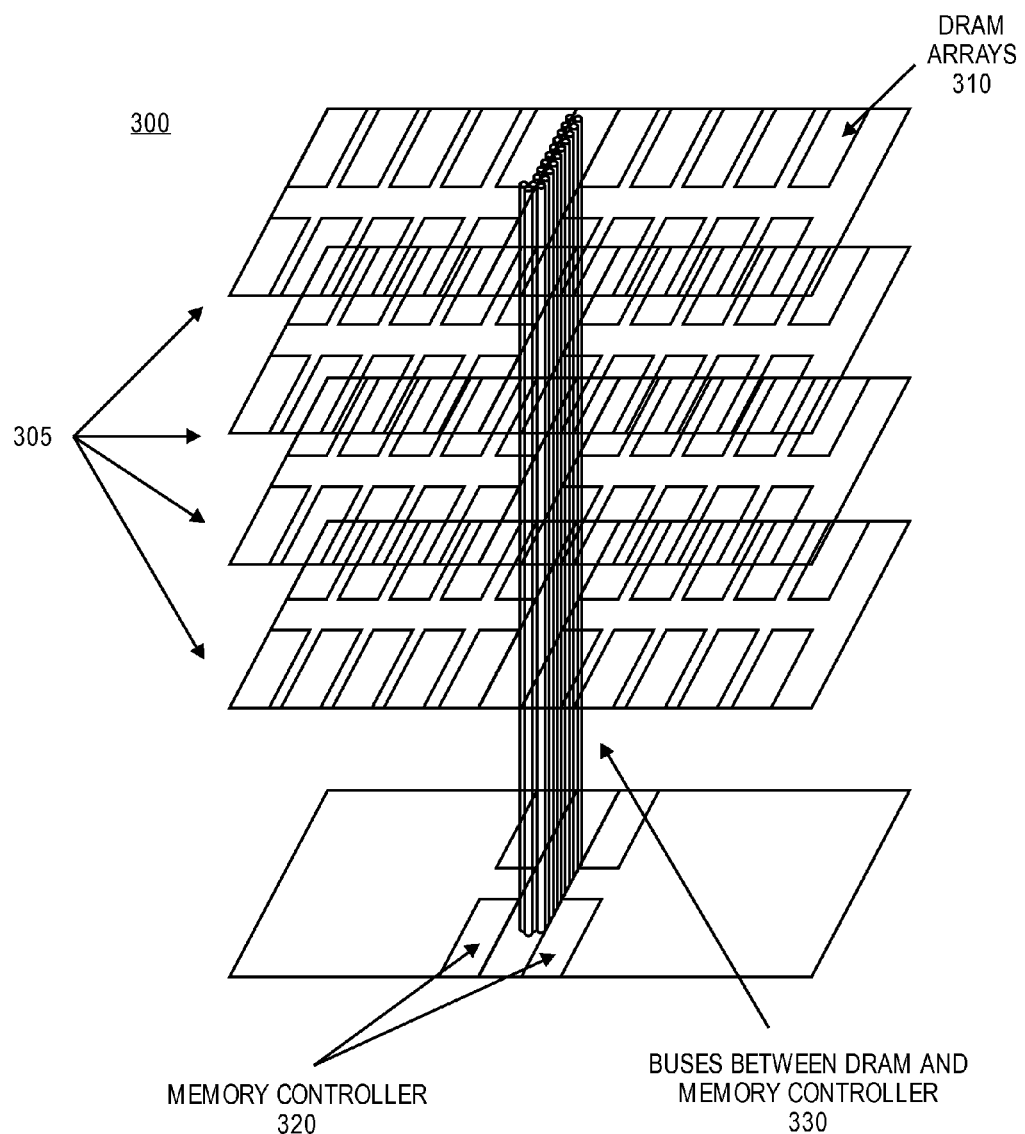
FIG. 3 is an illustration of a DRAM stack with each die having independent DRAM modules.

FIG. 3 is an illustration of a DRAM stack with each die having independent DRAM modules. In this illustration, a DRAM stack 300 includes various DRAM dies 305 stacked using connections provided by TSVs, each die including multiple DRAM arrays 310. The interconnecting signals between the memory controller 320 and the DRAM arrays 310 of the stacked dies 305 are fed through the TSVs 330.

In the implementation illustrated in FIG. 3, the DRAM dies 310 remain independent. An advantage in such implementation is that the TSVs are quite small compared to copper routing using on board designs like DIMMs, thus enabling faster signaling in comparison with signaling in a device in which layers were connected by conventional routing. However, the implementation of the stacked memory does not provide for modifications to address different power-performance trade-offs in response to different implementations or conditions of operation.

Figure 4:
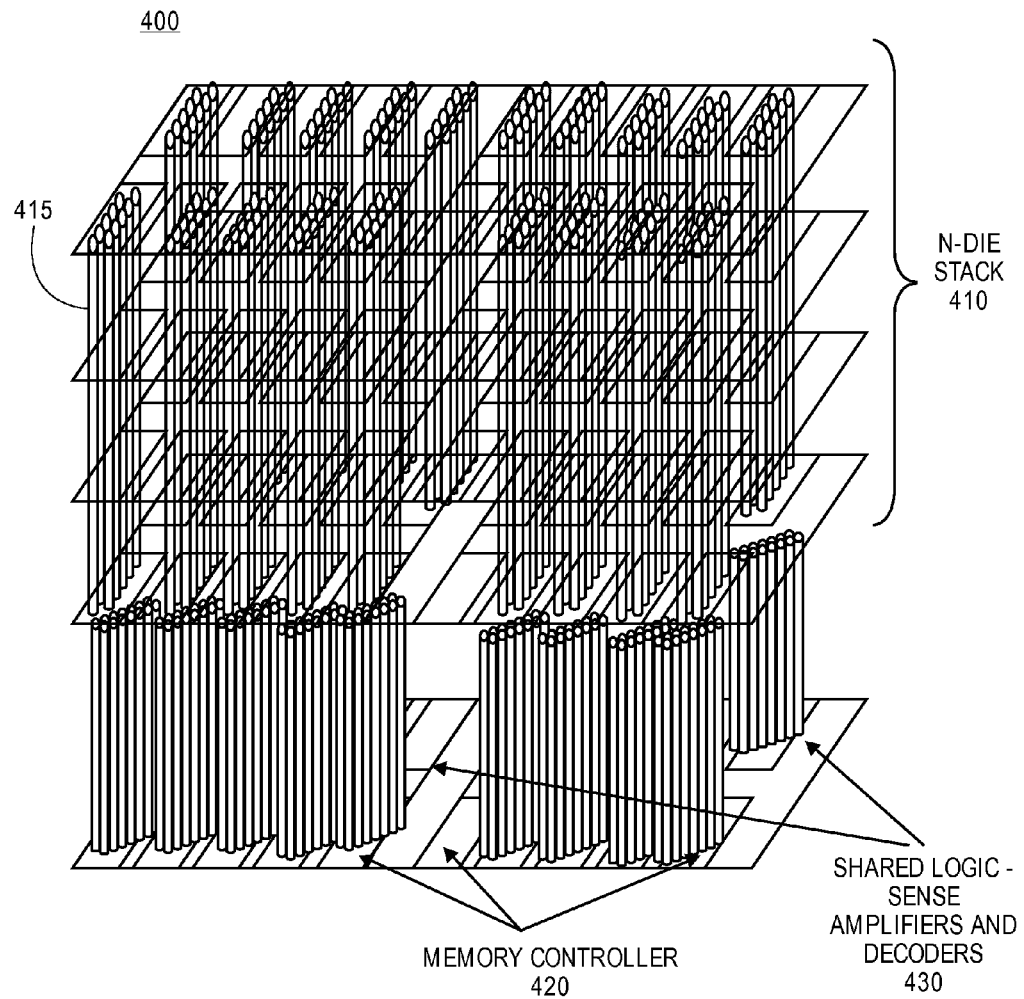
FIG. 4 is an illustration of a DRAM stack with shared memory logic.

FIG. 4 is an illustration of a DRAM stack with shared memory logic. In FIG. 4, a stacked memory device 400 includes N-die stack 410. The dies and system elements are connected by TSVs 415. In this implementation, the system elements include memory controller 420 and system shared logic circuits 430, the shared logic providing shared decoders and sense amplifiers. In this illustration, the device 400 includes bitline/wordline sharing across the stack, the shared logic 430 being shared by the entire stack 410. FIG. 4 is provided for general illustration, and is not intended to show the precise location of each element of the memory device 400. For example, the actual location of the memory controller 420 and the shared logic 430, and of the TSVs 415 for each of these elements, is not necessarily as shown in FIG. 4.

However, a limitation of the architecture shown in FIG. 4 is the high capacitive load and low dynamic performance provided by the memory device due to the use of the shared logic 430 in comparison with a memory device providing separate logic for memory array operation.

Figure 5:
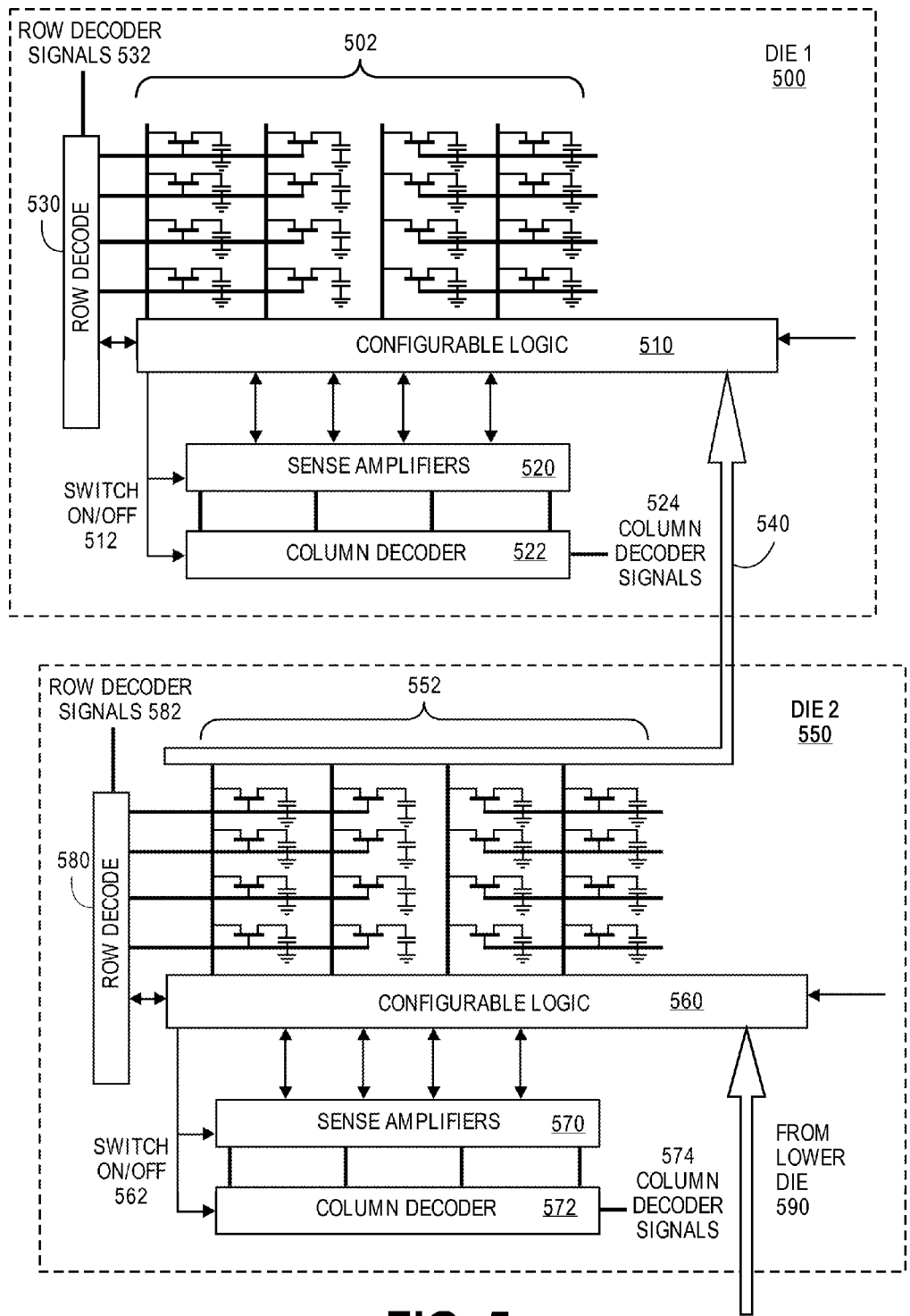
FIG. 5 is an illustration of an embodiment of a configurable memory stack.

FIG. 5 is an illustration of an embodiment of configurable memory stack. In FIG. 5, a memory stack includes multiple memory dies, including Die 1 (500) with memory elements 502 and Die 2 (550) with memory elements 552, where Die 1 and Die 2 are neighboring dies, such as Die 1 being above or below Die 2 in the memory stack. Die 1 includes a row decoder 530 receiving row decoder signals 532, a column decoder 522 receiving column decoder signals 524, and sense amplifiers 520; and Die 2 includes a row decoder 580 receiving row decoder signals 582, a column decoder 572 receiving column decoder signals 574, and sense amplifiers 570. While for purposes of illustration only a single memory array is shown for each of Die 1 and Die 2, a stacked memory device will generally include multiple memory arrays in each memory die layer.

In some embodiments, the memory dies include a configurable fabric to control the operation of the logic circuits for the memory, where the configurable logic provides for either using the peripheral logic circuit on the same die as the array on each of the individual dies, or provides for feeding the bitlines of the memory array to the next neighboring memory array in the lower or upper die in the stack and sharing the operation of peripheral logic circuits among such neighboring memory dies. In the latter configuration, redundant (unused) peripheral logic is disabled, and in some embodiments may be switched off when disabled. In some embodiments, the dies include configurable logic 510 in Die 1 and 560 in Die 2 to provide for modifying the configuration of the logic, which allows for bypassing the sense amplifiers and column decoder for one or more of the memory dies. In some embodiments, the configurable logic 510 and 560 is controlled by a memory controller, which is not illustrated in FIG. 5. In some embodiments, the memory dies may further provide for turning off one or more sense amplifiers or column decoders when such elements are not in operation, such as the on/off switch signal 512 for sense amplifiers 520 and column decoder 522 in Die 1 and on/off switch signal 562 for sense amplifiers 570 and column decoder 572 in Die 2. FIG. 5 illustrates an embodiment in which the column decoders and sense amplifiers for the memory dies may be bypassed, while the row decoder for each die remains in operation in each configuration of the memory device. However, embodiments are not limited to this particular logic circuit structure, and the enablement and disablement of peripheral memory logic may vary depending on the structure of the memory device.

FIG. 5 further illustrates the I/O connections that may be enabled between dies in some embodiments, such as connection 540 between the bitlines of memory 552 of die 2 and the bitlines of memory 502 of die 1, where such connection 540 may be enabled by the configurable logic 510. FIG. 5 further illustrates the connection 590 that may exist between bitlines of Die 2 and the bitlines of a lower die.

In some embodiments, a configurable memory stack, such as illustrated in FIG. 5, provides either individual die identity on the stack or minimal sharing of peripheral logic (which may be referred to as a high power or high performance mode) to provide increased performance, or a vertical 3D array configuration providing greater sharing of peripheral logic (which may be referred to as a low power or low performance mode) to reduce operating power by bypassing unused sense amplifiers and row/column decoders, which in some embodiments may be switched off. In some embodiments, by enabling a higher load on the memory I/O when the configuration logic is set to provide for sharing memory logic, fewer sense amplifiers and column decoders are in use in the memory device, resulting in lower active and background power. However, the enablement of fewer sense amplifiers and column decoders may result in a reduction in the performance of the memory device due to an increase in the time required to fetch a bit than if independent sense amplifier rows in each die are enabled. When fewer sense amplifiers are visible to the memory controller, a smaller fraction of memory content is directly visible to the memory controller, reducing the opportunity to quickly access data held by the sense amplifiers. Thus, there is a contention between, for example, a low power state and a high performance state providing increased granularity. While two modes are generally described here, referred to as a high performance mode and a low power mode relative to each other, embodiments are not limited to these modes, and may include any number of modes that result from varying combinations of shared peripheral memory logic in a stacked memory device.

As illustrated in FIG. 5, in an example of a first mode (such as a mode for greater performance) Die 1 and Die 2 may operate independently, with the peripheral logic of each die being enabled by the configurable logic to support the memory arrays on such die. In one implementation, configurable logic 510 of Die 1 may be set to enable sense amplifiers 520 and column decoder 522 for memory elements 502, such that the memory elements 502 of die 1 utilizes row decoder 530, sense amplifiers 520, and column decoder 522; and configurable logic 560 of Die 2 may be set to enable sense amplifiers 570 and column decoder 572 for memory elements 552, such that the memory elements 552 of die 2 utilize row decoder 580, sense amplifiers 570, and column decoder 572. Configurable logic 510 further disables the connection 540 between the bitlines of memory 510 and the bitlines of memory 552.

In an example of a second mode (such as a mode for reduced power consumption), the configurable logic of Die 1 and Die 2 may be set to provide for the memory on Die 1 and Die 2 to operate using shared peripheral logic. In one implementation, the configurable logic 510 may be set to disable sense amplifiers 520 and column decoder 522 (which may include switching such elements off 512) and to enable connection 540 of the bits lines of memory 502 with the bit lines of memory 552. Further, the configurable logic 560 may be set to enable sense amplifiers 570 and column decoder 572 for shared operation. In such operation, memory elements 502 of die 1 operate utilizing row decoder 530 and memory elements 552 of die 2 operate utilizing row decoder 580, and both memory elements 502 and memory elements 552 utilize the shared peripheral logic of sense amplifiers 570 and column decoder 572.

However, the operation of Die 1 and Die 2 of FIG. 5 are not limited to these examples. In an example of a third mode, the configurable logic of Die 1 and Die 2 may be set to provide for the memory on Die 1 and Die 2 to operate using shared peripheral logic on another die, where the connection 590 from a lower die is enabled to provide for a connection with the bitlines of memory 552, where shared peripheral logic may be located on the lower die. In such third mode, memory arrays of at least three memory dies may utilize the shared peripheral logic, where, for example, sense amplifiers 520, column decoder 522, sense amplifiers 570, and column decoder 572 may all be disabled, with peripheral logic of the lower die being enabled. Other examples may also be provided regarding differing configurations for sharing peripheral logic. While the examples provided here described the peripheral logic of the lower die of multiple dies acting as shared logic, embodiments are not limited to this particular configuration.

Further, embodiments are not limited to enabling and disabling of the sharing of the peripheral logic of column decoders and sense amplifiers and the enablement and disablement of the connection of bitlines between memory arrays as illustrated in FIG. 5. In a modified implementation (not illustrated in FIG. 5), configurable logic may provide for enabling or disabling the sharing of row decoders between memory arrays, with other unused row decoders being disabled, and for enabling or disabling the connection of wordlines between memory arrays. In such implementation, the column decoder for each memory array would remain in use when in a shared mode of operation, with the memory arrays sharing the row decoder of one of the memory arrays. In some embodiments, the row decoders may be powered down when not in use. In some embodiments, the sense amplifiers for each memory array may remain in use when the memory arrays are in a shared mode of operation.

In some embodiments, configurable signals for control of, for example, configurable logic 510 and 560 illustrated in FIG. 5, may be controlled by the memory controller, where such control may be a stand-alone function of the memory controller or may be provided with guidance from one or more other elements, such as from the operating system, apparatus or system hardware elements, performance control firmware, or other source. In some embodiments, the control of the configurable logic may be based on the workload of the memory device, the state of the system or apparatus including the memory, or other factor affecting memory operation. In some embodiments, the configurable architecture of the DRAM stack enables the memory controller to adapt the organization of the main memory subsystem during run-time. The more peripheral logic is active, the better the controller can schedule accesses concurrently and exploit locality in concurrent sense amplifier accesses on parallel memory arrays at the expense of higher power consumption for the amplifiers, while the less peripheral logic is active the smaller the power drain caused by memory operation. Thus, the memory controller may utilize the configurable logic to more effectively manage and trade off performance and power consumption of the memory subsystem depending on the current requirements of the system while the overall memory capacity is maintained.

Figure 6:
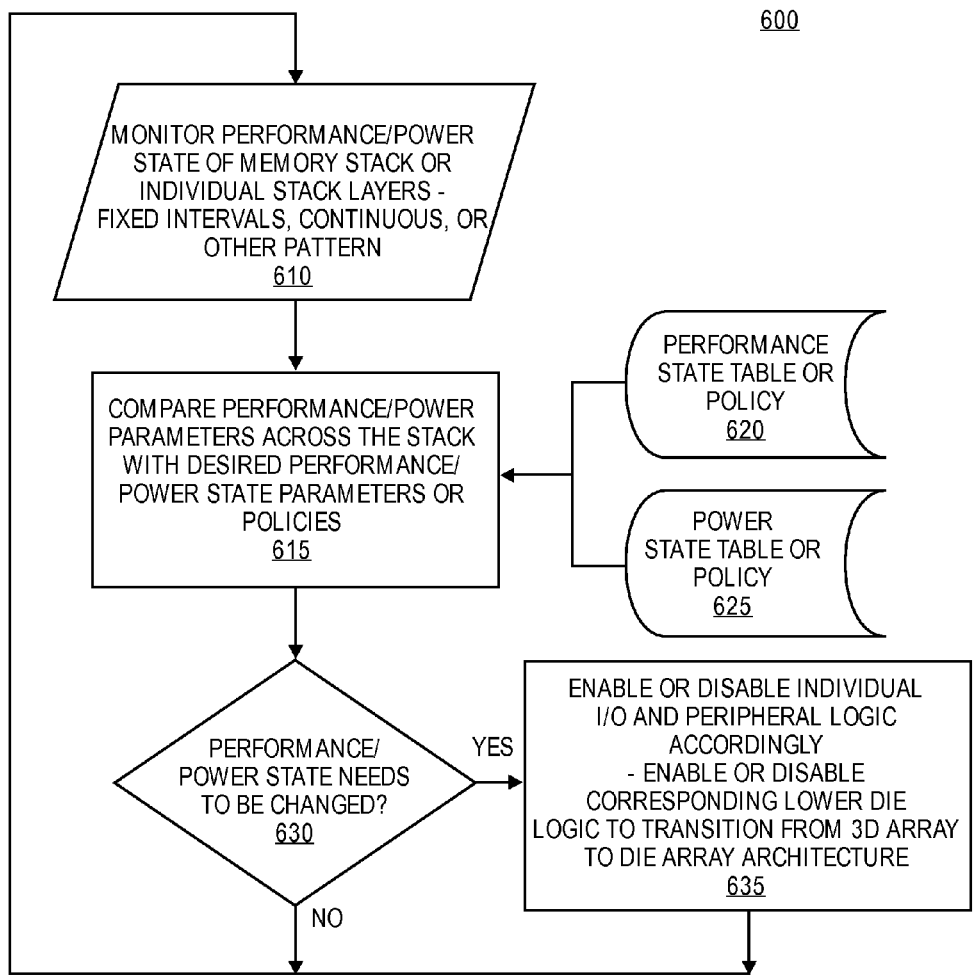
FIG. 6 is a flowchart to illustrate operation of a configurable memory stack.

FIG. 6 is a flowchart to illustrate operation of a configurable memory stack. FIG. 6 depicts an algorithm 600 for implementing a configurable performance/power state in a memory. In some embodiments, depending upon the power or performance state, the memory stack may be configured to utilize the die-level DRAM array granularity, or the 3D DRAM array structure using shared peripheral logic, or any combination of separate and shared peripheral logic. In some embodiments, it is possible to have a mixed granularity with some of the array sharing a 3D structure while others working in a 2D configuration.

In some embodiments, the performance, power state, or both of a memory stack or individual stack layers of the memory stack are monitored 610. In some embodiments, the monitoring may be at fixed intervals, continuous, or according to other monitoring timing. In some embodiments, determined parameters for performance, power state, or both across the memory stack are compared with certain desired performance/power state parameters or policies 615. In some embodiments, such parameters or policies may be derived from a performance state table or policy 620, a power state table or policy 625, or both, but embodiments are not limited to these particular control structures, and may include any standard or threshold for power or performance comparison.

In some embodiments, the desired performance/power state parameters or policies may vary depending on a state of memory device or the apparatus or system that includes the memory device. In a first example, a parameter or policy may be set to require higher performance, and thus increased granularity in operation of peripheral logic, if the apparatus or system is experiencing high data traffic. In a second example, a parameter or policy may be set to require greater use of shared logic if the apparatus or system is a mobile device running on a limited battery source. In a third example, a parameter or policy may require configuration modifications based on heat conditions for the memory device, such as shifting the logic configuration to shared peripheral logic (utilizing less power, and thus generating less heat) if one or more sensors indicate that the memory device is producing excess heat. However, these are examples, and embodiments are not limited to these examples.

In some embodiments, a determination is made whether the performance/power state needs to be changed 630 based on the comparison of the determined state parameters with the desired state parameters or policies 615. If so, individual I/O and peripheral logic and sense amplifiers are enabled or disabled accordingly. In addition, corresponding lower die logic to transition from a 3D array to a die array architecture is enabled or disabled 635.

Figure 7:
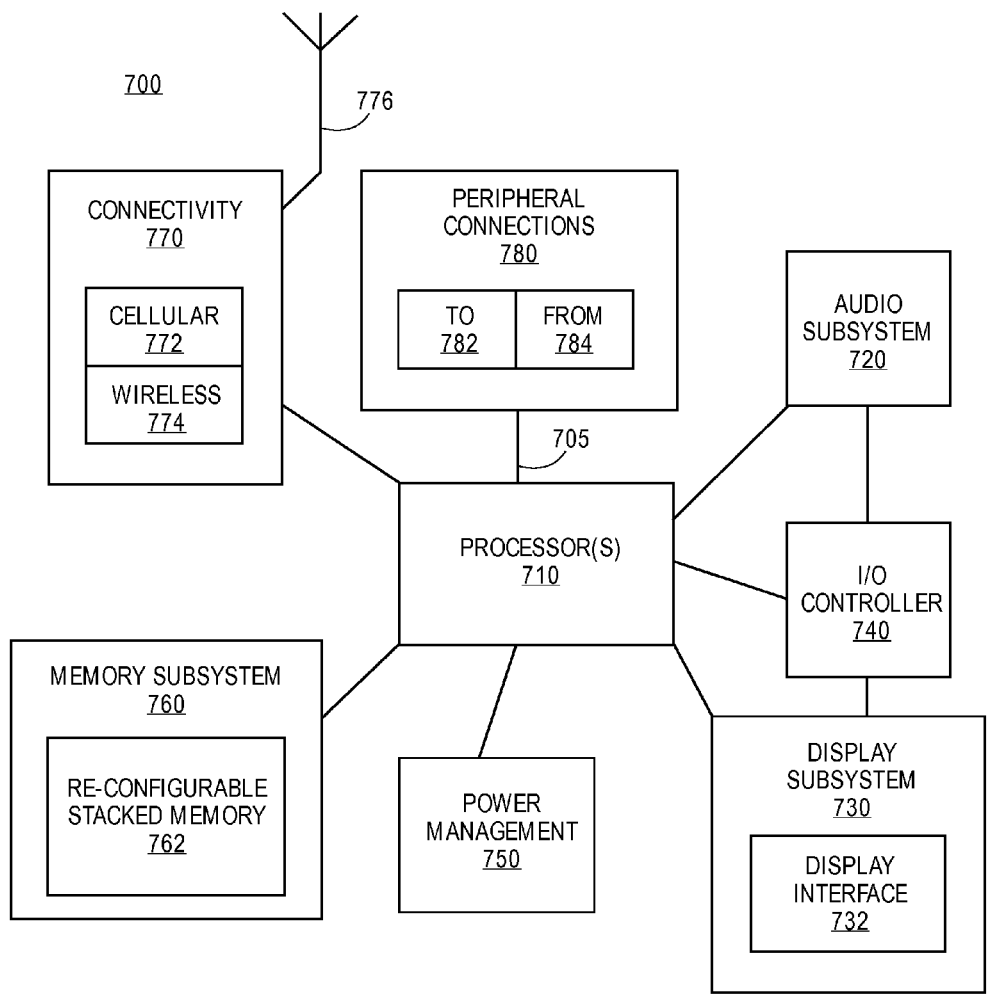
FIG. 7 is an illustration of an embodiment of an apparatus or system including a configurable stacked memory.

FIG. 7 is an illustration of an embodiment of an apparatus or system including a configurable stacked memory. Computing device 700 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 700. The components may be connected by one or more buses or other connections 705.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications, device functions, or both are executed. The processing operations include operations related to I/O (input/output) with a human user or with other devices, operations related to power management, operations, or both related to connecting device 700 to another device. The processing operations may also include operations related to audio I/O, display I/O, or both.

In one embodiment, device 700 includes audio subsystem 720, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 700, or connected to device 700. In one embodiment, a user interacts with device 700 by providing audio commands that are received and processed by processor 710.

Display subsystem 730 represents hardware (such as display devices) and software (such as drivers) components that provide a display having visual, tactile, or both elements for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touch screen device that provides both output and input to a user.

I/O controller 740 represents hardware devices and software components related to interaction with a user. I/O controller 740 can operate to manage hardware that is part of audio subsystem 720, a display subsystem 730, or both such subsystems. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720, display subsystem 730, or both such subsystems. For example, input through a microphone or other audio device can provide input or commands for one or more applications or functions of device 700. Additionally, audio output can be provided instead of or in addition to display output. In another example, if display subsystem includes a touch screen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation.

In some embodiments, memory subsystem 760 includes memory devices for storing information in device 700. The processor 710 may read and write data to elements of the memory subsystem 760. Memory can include nonvolatile (having a state that does not change if power to the memory device is interrupted), volatile (having a state that is indeterminate if power to the memory device is interrupted) memory devices, or both such memories. Memory 760 can store application data, user data, music, photos, documents, or other data, as well as system data (whether long-term or temporary) related to the execution of the applications and functions of system 700.

In some embodiments, the memory subsystem 760 may include a stacked memory device 762, wherein the stacked memory device is configurable to define whether the memory device enables the peripheral logic on the same die as the array on each of the individual dies of the stacked memory, or enables shared peripheral logic for multiple dies of the stacked memory device. A stacked memory device may include, for example, elements illustrated in FIG. 5.

Connectivity 770 includes hardware devices (e.g., connectors and communication hardware for wireless communication, wired communication, or both) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 776.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (such as downloading, uploading, changing, or synchronizing) content on device 700. Additionally, a docking connector can allow device 700 to connect to certain peripherals that allow device 700 to control content output, for example, to audio-visual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 8:
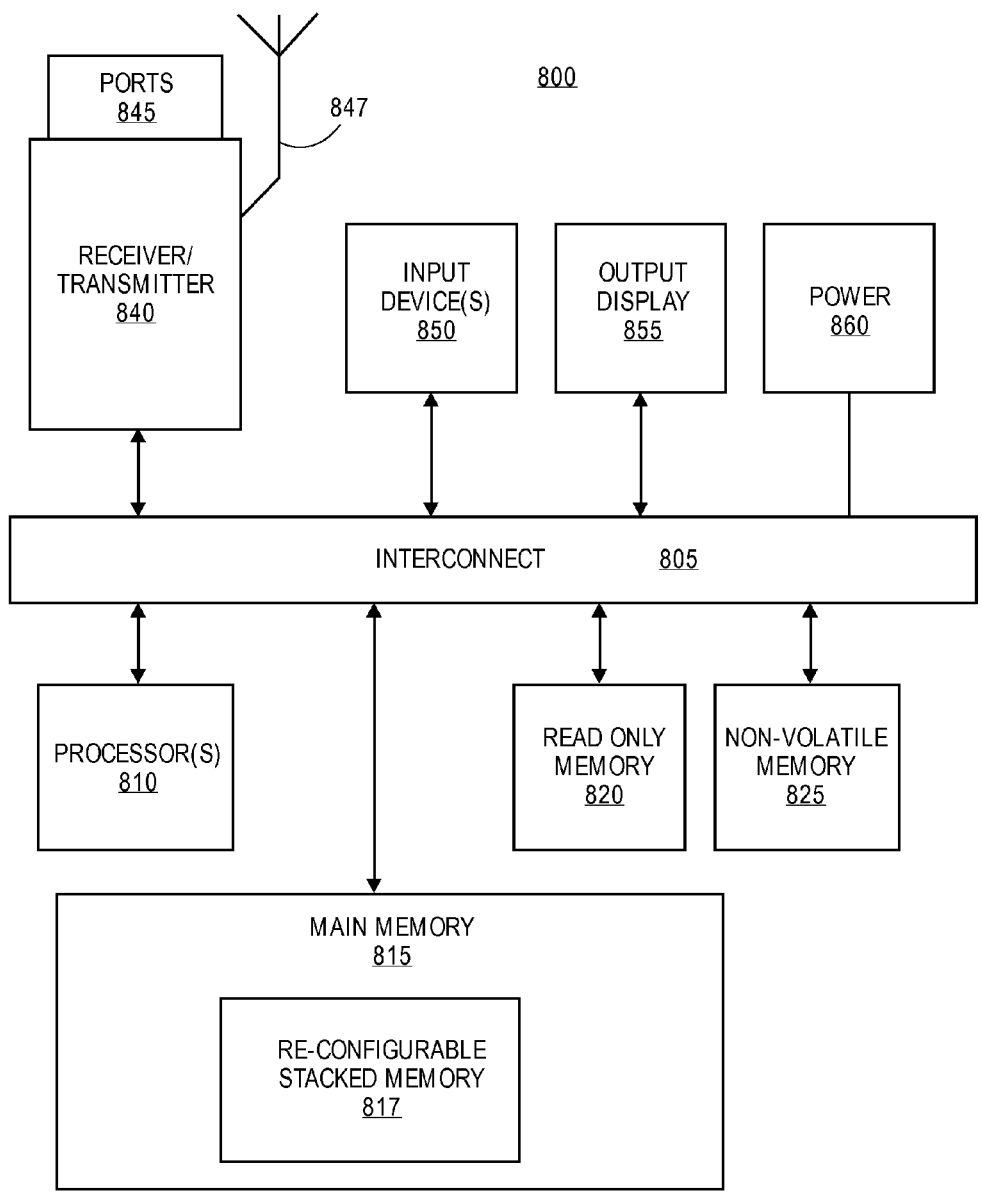
FIG. 8 an embodiment of a computing system including a configurable stacked memory.

FIG. 8 illustrates an embodiment of a computing system including a re-configurable stacked memory. The computing system may include a computer, server, game console, or other computing apparatus. In this illustration, certain standard and well-known components that are not germane to the present description are not shown. Under some embodiments, the computing system 800 comprises an interconnect or crossbar 805 or other communication means for transmission of data. The computing system 800 may include a processing means such as one or more processors 810 coupled with the interconnect 805 for processing information. The processors 810 may comprise one or more physical processors and one or more logical processors. The interconnect 805 is illustrated as a single interconnect for simplicity, but may represent multiple different interconnects or buses and the component connections to such interconnects may vary. The interconnect 805 shown in FIG. 8 is an abstraction that represents any one or more separate physical buses, point-to-point connections, or both connected by appropriate bridges, adapters, or controllers.

In some embodiments, the computing system 800 further comprises a random access memory (RAM) or other dynamic storage device or element as a main memory 815 for storing information and instructions to be executed by the processors 810. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 815 includes stacked memory 817, wherein the stacked memory device is configurable to define whether the memory device enables the peripheral logic on the same die as the array on each of the individual dies of the stacked memory, or enables shared peripheral logic for multiple dies of the stacked memory device. A stacked memory device may include, for example, elements illustrated in FIG. 5.

The computing system 800 also may comprise a read only memory (ROM) 820 or other static storage device for storing static information and instructions for the processors 810. The computing system 800 may include one or more non-volatile memory elements 825 for the storage of certain elements.

One or more transmitters or receivers 840 may also be coupled to the interconnect 805. In some embodiments, the computing system 800 may include one or more ports 845 for the reception or transmission of data. The computing system 800 may further include one or more omnidirectional or directional antennas 847 for the reception of data via radio signals.

In some embodiments, the computing system 800 includes one or more input devices 850, where the input devices include one or more of a keyboard, mouse, touch pad, voice command recognition, gesture recognition, sensors or monitors (including sensors or monitors providing power and performance data), or other device for providing an input to a computing system.

The computing system 800 may also be coupled via the interconnect 805 to an output display 855. In some embodiments, the display 855 may include a liquid crystal display (LCD) or any other display technology, for displaying information or content to a user. In some environments, the display 855 may include a touch-screen that is also utilized as at least a part of an input device. In some environments, the display 855 may be or may include an audio device, such as a speaker for providing audio information.

The computing system 800 may also comprise a power device or system 860, which may comprise a power supply, a battery, a solar cell, a fuel cell, or other system or device for providing or generating power. The power provided by the power device or system 860 may be distributed as required to elements of the computing system 800.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, a memory device includes a DRAM including a plurality of memory dies, each memory die including a plurality of memory arrays, each memory array including peripheral logic circuits and a configurable logic; and a system element coupled with the DRAM, the system element including a memory controller. The memory controller is to control the configurable logic of the memory arrays to provide for separate or shared peripheral logic circuits for one or more memory arrays, the configurable logic being configurable to enable or disable one or more of the peripheral logic circuits and to enable or disable one or more I/O (input/output) connections between the memory arrays.

In some embodiments, the configurable logic for each memory array is dynamically reconfigurable by the memory controller. In some embodiments, the memory controller is to set the configurable logic of the memory arrays based on performance consideration, power considerations, or both.

In some embodiments, the memory controller is to establish a first mode by setting the configuration logic for a plurality of memory arrays to provide that the peripheral logic circuits operate as separate peripheral logic circuits for each of the memory arrays. In some embodiments, the setting of the peripheral logic further provides for disabling I/O connections between a first array on a first die and a second array on a second die, wherein the first mode is a high performance mode.

In some embodiments, the memory controller is to establish a second mode by setting the configuration logic for a plurality of memory arrays to enable a first set of peripheral logic circuits operate as shared peripheral logic circuits for the memory arrays and to disable a second set of peripheral logic circuits. In some embodiments, the setting of the peripheral logic further provides for enabling I/O connections between a first array on a first die and a second array on a second die, wherein the second mode is a low power mode.

In some embodiments, the memory controller is to operate independently in setting the configuration logic of the memory arrays.

In some embodiments, the memory controller operates in response to external controls in setting the configuration logic of the memory arrays.

In some embodiments, the plurality of memory dies of the memory device are connected by TSVs.

In some embodiments, enabling or disabling peripheral logic circuits for one or more memory arrays includes enabling or disabling a column decoder and sense amplifiers for each of the one or more memory arrays. In some embodiments, disabling peripheral logic for the one or more memory arrays includes powering down the column decoder and sense amplifier for each of the one or more memory arrays.

In some embodiments, bitlines of a memory array on a first memory die are connected to a configurable logic of a memory array on a second memory die, and wherein enabling one or more I/O connections between one or more memory arrays includes connecting the bitlines of the memory array on the first memory die to bitlines of a memory array on the second memory die.

In some embodiments, a method includes monitoring an operational state relating to operation of a DRAM including a stack of memory dies, the operational state regarding performance, power consumption, or both; comparing the operational state to desired parameters or policies for performance, power consumption, or both to determine if the operational state should be modified; and upon determining that the operational state should be modified, enabling or disabling one or more peripheral logic circuits of memory arrays of the stack of memory dies and enabling or disabling one or more I/O connections between the memory arrays.

In some embodiments, modifying the operational state includes establishing a high performance state by disabling sharing of peripheral logic circuits for each of the memory arrays.

In some embodiments, modifying the operational state includes establishing a low power state by enabling sharing by the memory arrays of less than all the peripheral logic circuits.

In some embodiments, enabling or disabling peripheral logic circuits of the memory arrays and enabling or disabling one or more I/O connections between the memory arrays includes setting a configuration logic for each of the memory arrays.

In some embodiments, enabling or disabling peripheral logic circuits for the memory arrays includes enabling or disabling a column decoder and sense amplifiers for each of the one or more memory arrays.

In some embodiments, enabling or disabling one or more I/O connections between the memory arrays includes enabling or disabling connections between bitlines of a first memory array and bitlines of a second memory array.

In some embodiments, a system includes a processor to process data for the system; a transmitter, receiver, or both coupled with an omnidirectional antenna to transmit data, receive data, or both; and a stacked device for the storage of data, the memory device including: a plurality of memory dies, each memory die including a plurality of memory arrays, each memory array including peripheral logic circuits and a configurable logic, and a system element coupled with the plurality of memory dies, the system element including a memory controller. In some embodiments, the memory controller is to control the configurable logic of the memory arrays to provide for separate or shared peripheral logic circuits for one or more memory arrays, the configurable logic being dynamically configurable to enable or disable one or more of the peripheral logic circuits and to enable or disable one or more I/O connections between the memory arrays.

In some embodiments, enabling or disabling peripheral logic circuits for one or more memory arrays includes enabling or disabling a column decoder and sense amplifiers for each of the one or more memory arrays.

In some embodiments, disabling peripheral logic for the one or more memory arrays includes powering down the column decoder and sense amplifier for each of the one or more memory arrays.

In some embodiments, bitlines of each memory array on a first memory die are connected to a configurable logic of a memory array on a second memory die, and wherein enabling one or more I/O connections between one or more memory arrays includes connecting the bitlines of a memory array on the first memory die to bitlines of a memory array on the second memory die.

In some embodiments, a computer-readable storage medium having stored thereon data representing sequences of instructions that, when executed by a processor, cause the processor to perform operations including monitoring an operational state relating to operation of a memory including a stack of memory dies, the operational state regarding performance, power consumption, or both; comparing the operational state to desired parameters or policies for performance, power consumption, or both to determine if the operational state should be modified; and upon determining that the operational state should be modified, enabling or disabling one or more the peripheral logic circuits of memory arrays of the stack of memory dies and enabling or disabling one or more I/O connections between the memory arrays.

In some embodiments, enabling or disabling peripheral logic circuits of the memory arrays and enabling or disabling one or more I/O connections between the memory arrays includes setting a configuration logic for each of the memory arrays.

In some embodiments, enabling or disabling peripheral logic circuits for the memory arrays includes enabling or disabling a column decoder and sense amplifiers for each of the one or more memory arrays.

In some embodiments, enabling or disabling one or more I/O connections between the memory arrays includes enabling or disabling connections between bitlines of a first memory array and bitlines of a second memory array.

What is claimed is:

1. A memory device comprising:
   a dynamic random-access memory (DRAM) including a plurality of memory dies, each memory die including a plurality of memory arrays, each memory array including peripheral logic circuits and a configurable logic; and
   a system element coupled with the DRAM, the system element including a memory controller;
   wherein the memory controller is to control the configurable logic of the memory arrays to provide for separate or shared peripheral logic circuits for one or more memory arrays, the configurable logic being configurable to enable or disable one or more of the peripheral logic circuits and to enable or disable one or more I/O (input/output) connections between the memory arrays.

2. The memory device of claim 1, wherein the configurable logic for each memory array is dynamically reconfigurable by the memory controller.

3. The memory device of claim 2, wherein the memory controller is to set the configurable logic of the memory arrays based on performance consideration, power considerations, or both.

4. The memory device of claim 3, wherein the memory controller is to establish a first mode by setting the configuration logic for a plurality of memory arrays to provide that the peripheral logic circuits operate as separate peripheral logic circuits for each of the memory arrays.

5. The memory device of claim 4, wherein the setting of the peripheral logic further provides for disabling I/O connections between a first array on a first die and a second array on a second die.

6. The memory device of claim 4, wherein the first mode is a high performance mode.

7. The memory device of claim 4, wherein the memory controller is to establish a second mode by setting the configuration logic for a plurality of memory arrays to enable a first set of peripheral logic circuits operate as shared peripheral logic circuits for the memory arrays and to disable a second set of peripheral logic circuits.

8. The memory device of claim 7, wherein the setting of the peripheral logic further provides for enabling I/O connections between a first array on a first die and a second array on a second die.

9. The memory device of claim 7, wherein the second mode is a low power mode.

10. The memory device of claim 2, wherein the memory controller is to operate independently in setting the configuration logic of the memory arrays.

11. The memory device of claim 2, wherein the memory controller operates in response to external controls in setting the configuration logic of the memory arrays.

12. The memory device of claim 1, wherein the plurality of memory dies are connected by through silicon vias (TSVs).

13. The memory device of claim 1, wherein enabling or disabling peripheral logic circuits for one or more memory arrays includes enabling or disabling a column decoder and sense amplifiers for each of the one or more memory arrays.

14. The memory device of claim 13, wherein disabling peripheral logic for the one or more memory arrays includes powering down the column decoder and sense amplifier for each of the one or more memory arrays.

15. The memory device of claim 14, wherein bitlines of a memory array on a first memory die are connected to a configurable logic of a memory array on a second memory die, and wherein enabling one or more I/O connections between one or more memory arrays includes connecting the bitlines of the memory array on the first memory die to bitlines of a memory array on the second memory die.

16. A method comprising:
   monitoring an operational state relating to operation of a dynamic random-access memory (DRAM) including a stack of memory dies, the operational state regarding performance, power consumption, or both;
   comparing the operational state to desired parameters or policies for performance, power consumption, or both to determine if the operational state should be modified; and
   upon determining that the operational state should be modified, enabling or disabling one or more peripheral logic circuits of memory arrays of the stack of memory dies and enabling or disabling one or more I/O connections between the memory arrays.

17. The method of claim 16, wherein modifying the operational state includes establishing a high performance state by disabling sharing of peripheral logic circuits for each of the memory arrays.

18. The method of claim 16, wherein modifying the operational state includes establishing a low power state by enabling sharing by the memory arrays of less than all the peripheral logic circuits.

19. The method of claim 16, wherein enabling or disabling peripheral logic circuits of the memory arrays and enabling or disabling one or more I/O connections between the memory arrays includes setting a configuration logic for each of the memory arrays.

20. The method of claim 16, wherein enabling or disabling peripheral logic circuits for the memory arrays includes enabling or disabling a column decoder and sense amplifiers for each of the one or more memory arrays.

21. The method of claim 20, wherein enabling or disabling one or more I/O connections between the memory arrays includes enabling or disabling connections between bitlines of a first memory array and bitlines of a second memory array.

22. A system comprising:
a processor to process data for the system;
a transmitter, receiver, or both coupled with an omnidirectional antenna to transmit data, receive data, or both; and
a stacked device for the storage of data, the memory device including:
a plurality of memory dies, each memory die including a plurality of memory arrays, each memory array including peripheral logic circuits and a configurable logic, and
a system element coupled with the plurality of memory dies, the system element including a memory controller;
wherein the memory controller is to control the configurable logic of the memory arrays to provide for separate or shared peripheral logic circuits for one or more memory arrays, the configurable logic being dynamically configurable to enable or disable one or more of the peripheral logic circuits and to enable or disable one or more I/O (input/output) connections between the memory arrays.

23. The system of claim 22, wherein enabling or disabling peripheral logic circuits for one or more memory arrays includes enabling or disabling a column decoder and sense amplifiers for each of the one or more memory arrays.

24. The system of claim 23, wherein disabling peripheral logic for the one or more memory arrays includes powering down the column decoder and sense amplifier for each of the one or more memory arrays.

25. The memory device of claim 24, wherein bitlines of each memory array on a first memory die are connected to a configurable logic of a memory array on a second memory die, and wherein enabling one or more I/O connections between one or more memory arrays includes connecting the bitlines of a memory array on the first memory die to bitlines of a memory array on the second memory die.

26. A computer-readable storage medium having stored thereon data representing sequences of instructions that, when executed by a processor, cause the processor to perform operations comprising:
monitoring an operational state relating to operation of a memory including a stack of memory dies, the operational state regarding performance, power consumption, or both;
comparing the operational state to desired parameters or policies for performance, power consumption, or both to determine if the operational state should be modified; and
upon determining that the operational state should be modified, enabling or disabling one or more the peripheral logic circuits of memory arrays of the stack of memory dies and enabling or disabling one or more I/O (input/output) connections between the memory arrays.

27. The medium of claim 26, wherein enabling or disabling peripheral logic circuits of the memory arrays and enabling or disabling one or more I/O connections between the memory arrays includes setting a configuration logic for each of the memory arrays.

28. The medium of claim 27, wherein enabling or disabling peripheral logic circuits for the memory arrays includes enabling or disabling a column decoder and sense amplifiers for each of the one or more memory arrays.

29. The medium of claim 28, wherein enabling or disabling one or more I/O connections between the memory arrays includes enabling or disabling connections between bitlines of a first memory array and bitlines of a second memory array.

* * * * *